(12) United States Patent
White et al.

(10) Patent No.: US 6,853,603 B1
(45) Date of Patent: Feb. 8, 2005

(54) PROGRAMMABLE LOGIC DEVICE HAVING NONVOLATILE MEMORY WITH USER SELECTABLE POWER CONSUMPTION

(75) Inventors: Thomas H. White, Santa Clara, CA (US); William Bradley Vest, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/797,493

(22) Filed: Mar. 9, 2004

(51) Int. Cl.[7] ................................................ G11C 5/14
(52) U.S. Cl. ..................... 365/227; 365/226; 365/156; 326/39
(58) Field of Search ............................... 365/154, 156, 365/227, 226; 326/44, 45, 39

(56) References Cited

U.S. PATENT DOCUMENTS

| | | | | |
|---|---|---|---|---|
| 5,357,458 A | * | 10/1994 | Yu et al. ........................ | 365/49 |
| 6,442,698 B2 | * | 8/2002 | Nizar .......................... | 713/320 |

OTHER PUBLICATIONS

Altera, MAX 7000, Programmable Logic Device Family, Jun. 2003, ver. 606, Data Sheet, pp. 1–66 (Altera Corporation, 101 Innovation Drive, San Jose CA 95134) (see pp. 20–21).
Altera, MAX 9000, Programmable Logic Device Family, Jun. 2003, ver. 6.5, Data Sheet, pp. 1–46 (Altera Corporation, 101 Innovation Drive, San Jose, CA 95134) (see p. 26).

* cited by examiner

*Primary Examiner*—Andrew Q. Tran
(74) *Attorney, Agent, or Firm*—Townsend and Townsend and Crew LLP

(57) ABSTRACT

A programmable logic device includes a memory with user selectable power consumption. During configuration, the memory operates at a relatively high power consumption level and quickly outputs configuration information. During normal operation, the memory selectively operates at the high power level or at a lower power level. The lower power level provides a lower rate of memory access than the high power level. The lower power level may be selected when the user desires to power other areas of the programmable logic device or when the user desires a lower rate of memory access. In this manner, a single memory can serve multiple functions without consuming an excessive amount of power.

11 Claims, 3 Drawing Sheets

PROGRAMMABLE LOGIC DEVICE HAVING NONVOLATILE MEMORY WITH USER SELECTABLE POWER CONSUMPTION

BACKGROUND OF THE INVENTION

The present invention relates to programmable logic devices (PLDs). In particular, the present invention relates to a nonvolatile configuration memory as part of a PLD.

FIG. 1 generally shows a PLD 100. A PLD is generally an integrated circuit device with some degree of programmability or configurability. As such, PLDs are good choices for device controllers, because they can be easily configured to operate in a wide variety of potential device environments.

The PLD 100 is exemplary of many PLDs. The PLD 100 includes an interconnect 102 and various function blocks. (The function blocks may also be referred to in the industry as IP blocks.) Exemplary function blocks include a logic block 104, a memory block 106, a digital signal processor (DSP) block 108, input/output (I/O) blocks 110, a general-purpose processor block 112, a phase-locked loop block 114, and a configuration block 116. The interconnect connects the function blocks together. Based on the intended use of the PLD, the interconnect 102 and the various function blocks may be configured in various ways.

When the PLD 100 is powered up, configuration information is transferred from a nonvolatile memory to a static random access memory (SRAM). To reduce the configuration time, it is desirable that the nonvolatile memory be able to output the configuration information at a high rate. However, when the nonvolatile memory is outputting information at a high rate, it consumes a relatively large amount of power.

Furthermore, on a PLD, space is at a premium. When space issues arise, designers must make hard decisions regarding which function blocks to eliminate or reduce in size. A memory block is one type of function block that is often chosen to be eliminated or reduced in size to overcome space issues.

There is a need for a PLD with a fast configuration time, that has a relatively larger amount of memory than certain existing PLDs, and that does not consume too much power.

BRIEF SUMMARY OF THE INVENTION

The present invention is directed toward selectable power consumption of a flash memory in a PLD.

According to one embodiment of the present invention, a programmable logic device includes a nonvolatile memory and a control circuit. The memory stores configuration information and user defined information. The memory selectively operates according to a high power state and a low power state. The control circuit controls access to the memory with a power selection signal. The high power state corresponds to accessing the memory at a high rate and the second power state corresponds to accessing the memory at a low rate. During configuration of the PLD, the control circuit controls the memory to output the configuration information at the high rate. During normal operation of the PLD, the control circuit controls the memory to selectively access the user defined information at either the high rate or at the low rate, as selected.

According to another embodiment of the present invention, a method of operating a PLD includes three steps. During configuration of the PLD, the first step is selecting a high power state and outputting configuration information from a memory at a high rate. During normal operation of the PLD, the second step is selecting a low power state for selectively accessing said memory at a low rate. Also during normal operation of the PLD, the third step is selecting the first power state for selectively accessing the memory at the high rate. (Being selectable, the second and third steps may be performed in any order.)

In this manner, configuration may be performed quickly, yet without drawing too much power during normal operation, and the effective memory size of the PLD may be increased as compared to certain other configurations.

A fuller understanding of the embodiments of the present invention may be gained from the following drawings with reference to the corresponding detailed description.

DETAILED DESCRIPTION OF THE INVENTION

Figure 1:
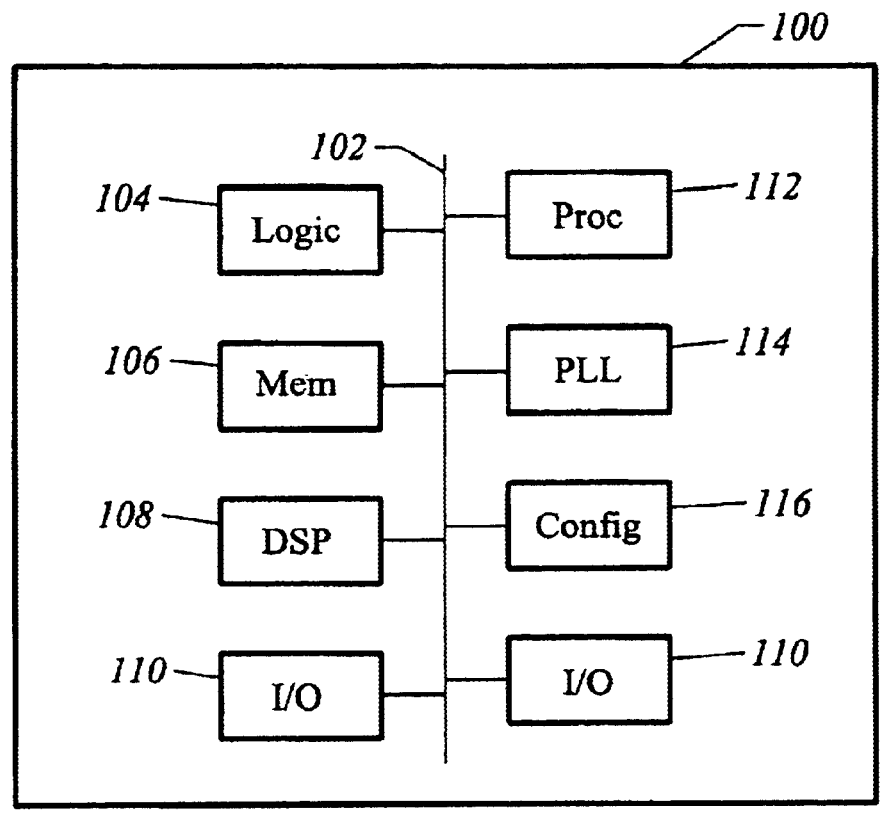
FIG. 1 is a block diagram of a programmable logic device (prior art).
Figure 2:
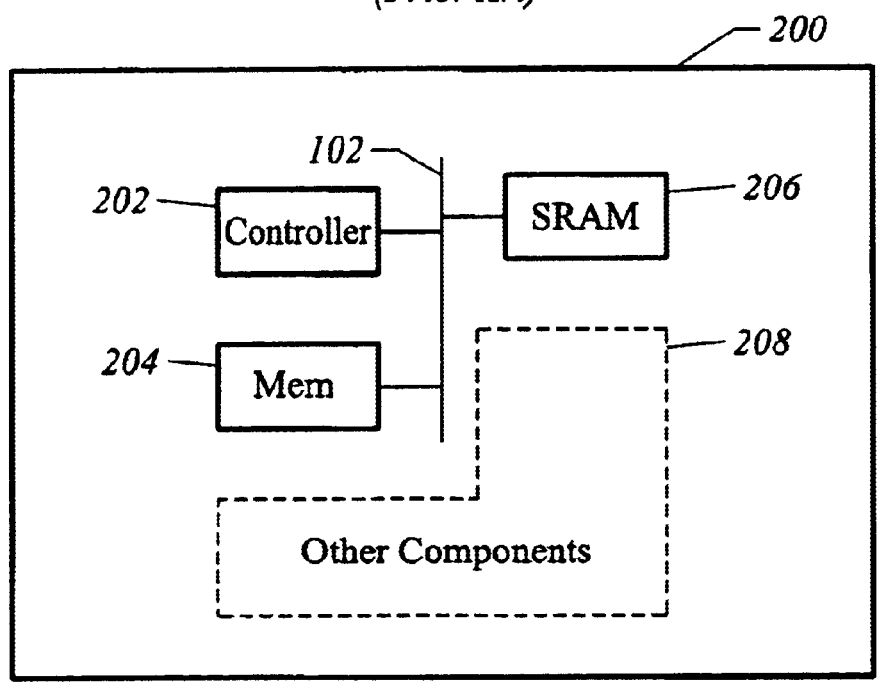
FIG. 2 is a block diagram of a programmable logic device according to an embodiment of the present invention.

FIG. 2 is a block diagram of a PLD 200 according to an embodiment of the present invention. The PLD 200 includes a controller 202, a memory 204, a static RAM (SRAM) 206, and various other components 208. The various other components 208 include the interconnect, function blocks, etc. (see FIG. 1) that are otherwise present in the PLD 200.

The controller 202 controls various operations of the PLD 200. The controller 202 may be implemented as a processor that executes a control program. The control program may be software, firmware, microcode, etc. The controller 202 may also be implemented as an application specific integrated circuit.

The memory 204 stores information used by the PLD 200. Such information includes configuration information for use when the PLD 200 is being configured at power-up. The memory 204 may also be used to store information during normal operation of the PLD 200. According to the present embodiment, the memory 204 is a nonvolatile memory. That is, the memory 204 stores information even when the PLD 200 is unpowered. The memory 204 may be implemented as flash memory, electrically erasable programmable ROM (EEPROM), programmable ROM, or other types of nonvolatile memory.

The memory 204 may be selectively operated in more than one power mode. In a high power mode, the memory 204 consumes a relatively large amount of power and performs read and write operations (collectively called accesses) at a relatively high speed. In a low power mode, the memory 204 consumes a relatively small amount of power and performs accesses at a relatively low speed.

The SRAM 206 stores information used by the PLD 200. As a static RAM, though, the SRAM 206 stores information only when the PLD 200 is powered. The SRAM 206 may be located in what is termed the core of the PLD 200.

The controller 202, memory 204 and SRAM 206 have roles both during configuration and during normal operation of the PLD 200.

Figure 3:
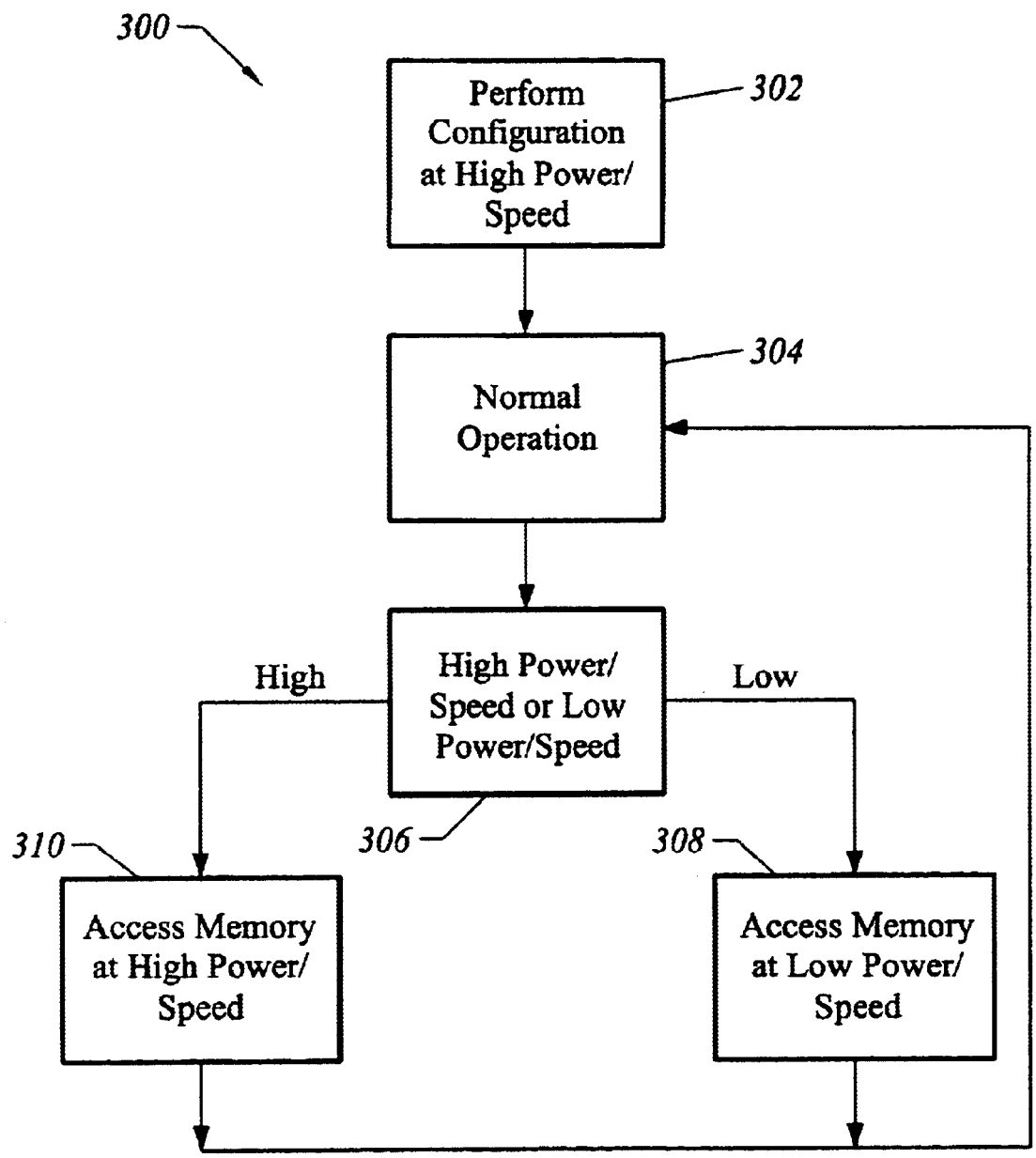
FIG. 3 is a flowchart of a method of operating a PLD according to an embodiment of the present invention.

FIG. 3 is a flowchart of a method 300 of operating the PLD 200. In step 302, the PLD 200 is powered up and the controller 202 controls a configuration operation. During the configuration operation, the controller 202 controls the memory 204 to output the configuration information from the memory 204 to the SRAM 206. In order to reduce the amount of time spent on the configuration operation, it is desirable to access the memory 204 at high speed. High speed operation of the memory 204 corresponds to relatively high power consumption, but since many other components of the PLD 200 are not yet active, high power consumption by the memory 204 is not a concern. Once the configuration information is in the SRAM 206, the PLD 200 uses the configuration information to perform the configuration process.

In step 304, after the configuration process has been completed, the PLD 200 enters the normal operation mode. In the normal operation mode, the other components of the PLD 200 are active and drawing power. As such, the power provided to the memory 204 may be reduced.

In step 306, the user of the PLD 200 would like to access the memory 204. (The term "user" includes a person directly signaling the PLD 200, a device directly or indirectly signaling the PLD 200, the PLD 200 itself operating according to instructions programmed into the PLD 200 that control power budgets or memory access speeds, and similar means for controlling a PLD, etc.) Such access may be desired in order to use the space in the memory 204 to increase the effective memory size of the PLD 200. The user can choose to access the memory 204 at high power and high speed or at low power and low speed. Low power and low speed access may be desirable when the other components of the PLD 200 are active and drawing power, in order to maintain a given level of overall power consumption for the PLD 200.

In step 308, low power access of the memory 204 is selected, and low speed access of the memory 204 is performed. After the memory access is completed, the PLD 200 returns to normal operation (step 304).

In step 310, high power access of the memory 204 is selected, and high speed access of the memory 204 is performed. After the memory access is completed, the PLD 200 returns to normal operation (step 304).

Figure 4:
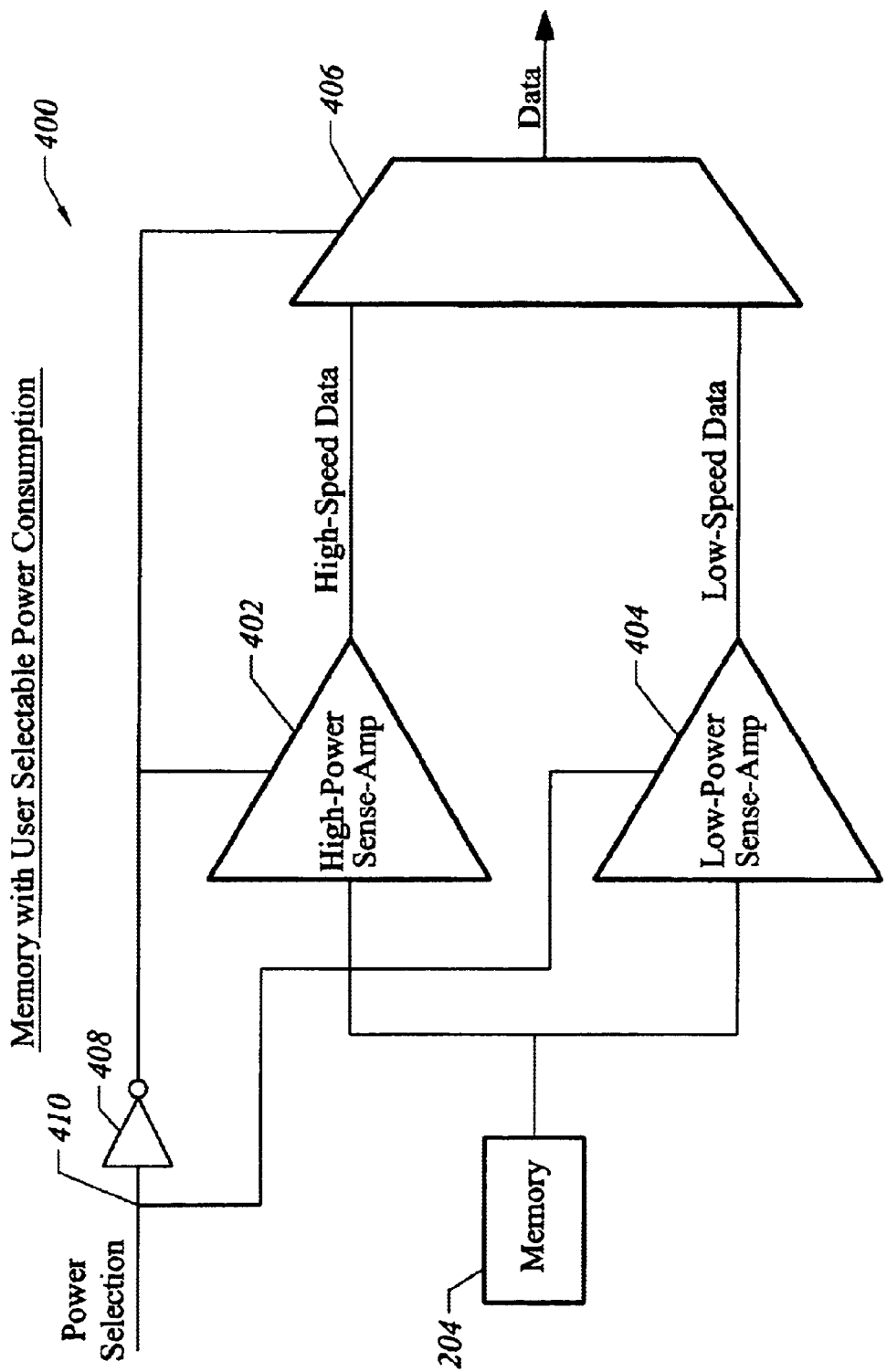
FIG. 4 is a block diagram of a memory and control circuitry in the PLD of FIG. 2 according to an embodiment of the present invention.

FIG. 4 is a block diagram of a memory and control system 400 in the PLD 200 according to an embodiment of the present invention. The memory and control system 400 includes the memory 204, a high-power sense amplifier 402, a low-power sense amplifier 404, a multiplexer 406, and a NOT gate 408. A power selection signal 410 may be generated by the controller 202 or other components of the PLD 200.

The high-power sense amplifier 402 generates high speed data output from the memory 204 during high power operation (during configuration or otherwise as selected during normal operation). The low-power sense amplifier 404 generates low speed data output from the memory 204 during low power operation (as selected during normal operation).

The power selection signal 410 controls the high-power sense amplifier 402 and the low-power sense amplifier 404. When the power selection signal is at a first level, the high-power sense amplifier 402 is active and the low-power sense amplifier 404 is inactive. When the power selection signal is at a second level, the high-power sense amplifier 402 is inactive and the low-power sense amplifier 404 is active.

The power selection signal 410 also controls the multiplexer 406. When the power selection signal is at the first level, the multiplexer 406 outputs the high-speed data from the high-power sense amplifier 402. When the power selection signal is at the second level, the multiplexer 406 outputs the low-speed data from the low-power sense amplifier 402. Other similar selection circuits or devices may be used in place of the multiplexer 406 in accordance with design considerations.

Thus, the embodiments of the present invention have numerous advantages. During configuration, high power access of the memory 204 is possible because the other components of the PLD 200 are not fully active. The configuration operation may be performed with a reduced time because the memory 204 may be accessed at high speed. During normal operation, the power level of the memory 204 may be reduced. The memory 204 is still available for storage, increasing the storage capacity of the PLD 200 compared to certain other PLDs. In addition, the memory 204 may be accessed at high speed when desired.

Although the description has mainly focused on outputting information from the memory 204, the two power modes (and corresponding speeds of operation) of the memory 204 are also applicable to inputting information to the memory 204. Outputs and inputs may both be referred to as accesses.

Although the above description has focused on specific embodiments, various modifications and their equivalents are to be considered within the scope of the present invention, which is defined by the following claims.

What is claimed is:

1. An apparatus including a programmable logic device, said programmable logic device comprising:

a memory that stores configuration information and user defined information, wherein said memory selectively operates according to a first power state and a second power state, wherein said second power state is a lower power consumption state than said first power state; and a control circuit, coupled to said memory, that controls access to said memory with a power selection signal, wherein said first power state corresponds to accessing said memory at a first rate and said second power state corresponds to accessing said memory at a second rate, wherein during configuration of said programmable logic device, said control circuit controls said memory to output said configuration information at said first rate, and wherein during normal operation of said programmable logic device, said control circuit controls said memory to selectively access said user defined information at one of said first rate and said second rate in accordance with said power selection signal, wherein said second rate is lower than said first rate.

2. The apparatus of claim 1, wherein said memory comprises a flash nonvolatile memory.

3. The apparatus of claim 1, wherein said memory comprises an electrically erasable programmable read only memory (EEPROM).

4. The apparatus of claim 1, wherein said control circuit comprises:

a first sense amplifier; coupled to said memory, that reads first information from said memory at said first rate, wherein said first sense amplifier is responsive to said power selection signal and operates according to said first power state;

a second sense amplifier, coupled to said memory, that reads second information from said memory at said second rate, wherein said second sense amplifier is responsive to said power selection signal and operates according to said second power state; and a data selector, coupled to said first sense amplifier and said second sense amplifier, that selectively outputs an output of one of said first sense amplifier and said second sense amplifier, in accordance with said power selection signal.

5. The apparatus of claim 4, wherein said first sense amplifier comprises a high-power sense amplifier.

6. The apparatus of claim 4, wherein said second sense amplifier comprises a low-power sense amplifier.

7. The apparatus of claim 4, wherein said data selector comprises a multiplexer.

8. The apparatus of claim 1, wherein said programmable logic device further comprises:

a plurality of function blocks that perform a plurality of functions, wherein said plurality of function blocks includes said memory and said control circuit; and an interconnect that interconnects said plurality of function blocks.

9. An apparatus including a control circuit for controlling a programmable logic device that includes a memory, said control circuit comprising:

a first sense amplifier, coupled to said memory, that reads first information from said memory at a first rate, wherein said first sense amplifier is responsive to a power selection signal and operates according to a first power state;

a second sense amplifier, coupled to said memory, that reads second information from said memory at a second rate, wherein said second sense amplifier is responsive to said power selection signal and operates according to a second power state; and a data selector, coupled to said first sense amplifier and said second sense amplifier, that selectively outputs an output of one of said first sense amplifier and said second sense amplifier, in accordance with said power selection signal, wherein said control circuit controls access to said memory with said power selection signal, wherein said first power state corresponds to accessing said memory at said first rate and said second power state corresponds to accessing said memory at said second rate, wherein during configuration of said programmable logic device, said control circuit controls said memory to output configuration information at said first rate, and wherein during normal operation of said programmable logic device, said control circuit controls said memory to selectively access user defined information at one of said first rate and said second rate in accordance with said power selection signal, wherein said second rate is lower than said first rate.

10. An apparatus including a programmable logic device, said programmable logic device comprising:

a plurality of function blocks that perform a plurality of functions, wherein said plurality of function blocks includes:

a memory that stores configuration information and user defined information, wherein said memory selectively operates according to a first power state and a second power state, and wherein said second power state is a lower power consumption state than said first power state, and a control circuit that controls access to said memory with a power selection signal, wherein said first power state corresponds to accessing said memory at a first rate and said second power state corresponds to accessing said memory at a second rate; and an interconnect that interconnects said plurality of function blocks, wherein during configuration of said programmable logic device, said control circuit controls said memory to output said configuration information at said first rate, and wherein during normal operation of said programmable logic device, said control circuit controls said memory to selectively access said user defined information at one of said first rate and said second rate in accordance with said power selection signal, wherein said second rate is lower than said first rate.

11. A method of operating a programmable logic device, comprising the steps of:

during configuration of said programmable logic device, selecting a first power state and outputting configuration information from a memory at a first rate;

after configuration during normal operation of said programmable logic device, selecting a second power state for selectively accessing said memory at a second rate, wherein said second rate is lower than said first rate, and wherein said second power state is a lower power consumption state than said first power state; and after configuration during normal operation of said programmable logic device, selecting said first power state for selectively accessing said memory at said first rate.

* * * * *